United States Patent
Orlowski et al.

(10) Patent No.: US 7,105,430 B2
(45) Date of Patent: Sep. 12, 2006

(54) METHOD FOR FORMING A SEMICONDUCTOR DEVICE HAVING A NOTCHED CONTROL ELECTRODE AND STRUCTURE THEREOF

(75) Inventors: Marius K. Orlowski, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 126 days.

(21) Appl. No.: 10/811,461

(22) Filed: Mar. 26, 2004

(65) Prior Publication Data

US 2005/0215008 A1   Sep. 29, 2005

(51) Int. Cl.
*H01L 21/3205* (2006.01)
(52) U.S. Cl. ...................... 438/592; 438/305
(58) Field of Classification Search ............... 438/592, 438/301, 303, 305, 585
See application file for complete search history.

(56) References Cited

U.S. PATENT DOCUMENTS

| 5,834,817 | A | 11/1998 | Satoh |
| 6,225,168 | B1 * | 5/2001 | Gardner et al. ............. 438/287 |
| 6,624,483 | B1 | 9/2003 | Kurata |
| 6,645,840 | B1 | 11/2003 | Grider |
| 6,646,326 | B1 | 11/2003 | Kim |
| 2003/0201505 | A1 | 10/2003 | Kurata |
| 2005/0014353 | A1 * | 1/2005 | Mansoori et al. ........... 438/592 |

FOREIGN PATENT DOCUMENTS

WO   WO 00/34984   6/2000

OTHER PUBLICATIONS

Pidin et al., "A Notched Metal Gate MOSFET for sub-0.1 μm Operation," IEEE, pp. 29.1.1-29.1.4 (2000).
Ghani et al., "100 nm Gate Length High Performance/Low Power CMOS Transistor Structure," IEEE, IEDM 99-415, pp. 17.1.1-17.1.4 (1999).
Skotnicki et al., "Well-controlled, Selectively Under-Etched Si/SiGe gates for RF and High Performance CMOS," IEEE 2000 Symposium on VLSI Technology Digest of Technical Papers, pp. 156-157.
Nakai et al., "A 100 nm CMOS Technology with Sidewall Notched 40 nm Transistors and SiC-Capped Cu/VLK Interconnects for High Performance Microprocessor Applications," IEEE 2002 Symposium on VLSI Technology Digest of Technical Papers, pp. 66-67.
Wu et al., "Notched Sub-100 nm Gate MOSFETs for Analog Applications," IEEE 2001 Solid-State and Integrated-Circuit Technology Proceedings, pp. 539-542.
Pidin et al., "Experimental and Simulation Study on Sub-50 nm CMOS Design," 2001 Symposium on VLSI Technology Digest of Technical Papers, pp. 35-36.

* cited by examiner

*Primary Examiner*—Richard A. Booth
(74) *Attorney, Agent, or Firm*—Kim Marie Vo; Daniel D. Hill

(57) ABSTRACT

A method for forming a semiconductor device (10) includes providing a substrate (20) having a surface; forming an insulating layer (22) over the surface of the substrate (20); forming a first patterned conductive layer (30) over the insulating layer (22); forming a second patterned conductive layer (32) over the first patterned conductive layer (30); forming a patterned non-insulating layer (34) over the second patterned conductive layer (32); and selectively removing portions of the first and second patterned conductive layers (30, 32) to form a notched control electrode for the semiconductor device (10).

15 Claims, 3 Drawing Sheets

METHOD FOR FORMING A SEMICONDUCTOR DEVICE HAVING A NOTCHED CONTROL ELECTRODE AND STRUCTURE THEREOF

FIELD OF THE INVENTION

This invention relates generally to semiconductor devices, and more specifically, to control electrodes.

BACKGROUND

When etching a polysilicon control electrode, the bottom corners of the polysilicon control electrode may be removed thereby undercutting or notching the control electrode. If the notching is uninhibited then the amount of undercutting is unknown and unpredictable, but, if controlled, the notching can be desirable. By predetermining the size of the notches in the control electrode, the gate length and the Miller capacitance of the polysilicon control electrode are desirably reduced.

As device dimensions shrink, there is a need to control the different threshold voltages ($V_t$) of the N-MOS and P-MOS devices. In addition, as the thickness of the gate dielectric decreases polysilicon depletion effects occur in the polysilicon control electrode. Substituting a metal material for polysilicon as a control electrode eliminates the polysilicon depletion effects. In addition, metal materials exist that have appropriate work function levels to set the desired threshold voltages for the NMOS and PMOS devices. Therefore, as the industry moves toward metal control electrodes, the benefits of undercutting a polysilicon control electrode are eliminated. Therefore, a need exists to be able to controllably decrease the gate length and miller capacitance of metal control electrodes.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Portions of a first conductive layer and a second conductive layer are selectively removed, such as by etching, to create a notch. Preferably, the amount to be removed is predetermined. The process may be used to form notches on opposite sides of a control electrode. In one embodiment, the notches can be created by selectively etching the second conductive layer and selectively etching the first conductive layer. In another embodiment, the portions of the first conductive layer are removed by oxidation of the portions of the first conductive layer. A second insulating layer may be formed in the notches and on the opposite sides of the control electrode. In addition, sidewall spacers may be formed on the second insulating layer on the opposite sides and in the notches of the control electrode.

Figure 1:
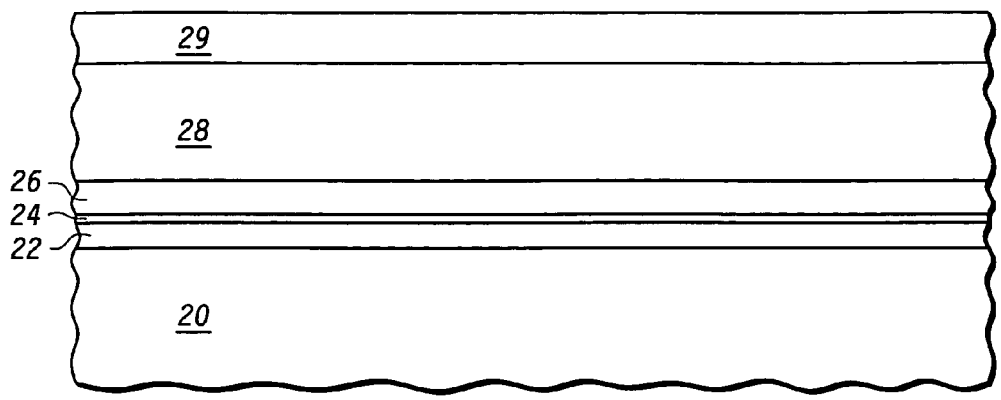
FIG. 1 illustrates a cross-sectional view of a portion of a semiconductor device having multiple layers formed over a semiconductor substrate in accordance with an embodiment of the present invention.

Shown in FIG. 1 is a portion of a semiconductor device 10 having a semiconductor substrate 20, a first insulating layer 22, a first non-insulating layer 24, a conductive layer 26, and a second non-insulating layer 28, and a second insulating layer 29. The non-insulating layers can be semiconductive layers or conductive layers The semiconductor substrate 20 can be any semiconductor material or combinations of materials, such as gallium arsenide, silicon germanium, silicon-on-insulator (SOI), silicon, monocrystalline silicon, the like, and combinations of the above. Although not shown, the semiconductor substrate 20 includes a doped well (i.e., N-well or P-well). The first insulating layer 22 can be any insulating material (e.g., silicon dioxide) including a high dielectric constant (hi-k) material (e.g., hafnium oxide ($HfO_2$), aluminum nitride (AlN), aluminum oxide ($Al_2O_3$), tantalum pentoxide ($TaO_5$), barium titanium oxide ($BaTiO_3$), lanthanum aluminate ($LaAlO_3$) or zirconium oxide ($ZrO_2$)), or combinations of such materials (e.g., a stack of hafnium oxide and zirconium oxide, a stack of hafnium oxide and silicon dioxide, and a stack of hafnium oxide, zirconium oxide, and silicon dioxide), and the like. The first insulating layer 22 can be deposited by chemical vapor deposition (CVD), atomic layer deposition (ALD), physical vapor deposition (PVD), the like or combinations of the above, or thermally grown. In one embodiment, the first insulating layer is approximately 4 to 5 nanometers (40 to 50 Angstroms) of hafnium oxide.

The first non-insulating layer 24 is chosen to set the threshold voltage of the semiconductor device being formed. The desired threshold voltage will depend on whether an N-MOS or P-MOS semiconductor device is being formed. For an N-MOS device, the first non-insulating layer 24 may be tantalum carbide (TaC), tantalum nitride (TaN), nickel silicide (NiSi), tantalum silicide (TaSi), cobalt silicide (CoSi), tungsten (W), the like and combinations of the above. For a P-MOS device, the first non-insulating layer 24 may be titanium nitride, rhenium (Re), platinum (Pt), ruthenium oxide ($RuO_2$), rhodium silicide (RhSi), palladium silicide (PdSi), tungsten carbon nitride ($WC_xN_y$), the like and combinations of the above. In one embodiment, the first non-insulating layer 24 can be a stack of materials, where the combination of the work functions of the two materials satisfies the desirable work function for the semiconductor device 10. For example, a 5 nanometer thick material with a first work function and a 5 nanometer thick material with a second work function can make up the first non-insulating layer 24 so that the first non-insulating layer 24 has a work function that is between the first work function and the second work function. The first non-insulating layer 24 can be formed by CVD, PVD, ALD, plating, the like and combinations of the above. In one embodiment, the first conductive layer is approximately 1 to 40 nanometers (10 to 400 Angstroms).

The conductive layer 26 may be doped silicon germanium (SiGe), doped silicon (Si), doped silicon carbide (SiC), silicides, metal carbides, metal nitrides, the like or combinations of the above. If the conductive layer 26 is a doped layer it may be in situ doped or doped via implantation methods, for example. The conductive layer 26 may be formed by CVD, PVD, ALD, plating, the like and combinations of the above. In one embodiment, the conductive layer 26 is approximately 25 to 50 nanometers (250 to 500 Angstroms) in thickness. Regardless, the conductive layer 26 is preferably thicker than the first non-insulating layer 24 to enable notch formation, as will be better understood after further explanation hereunder.

The second non-insulating layer 28 may be a semiconductive material (e.g., polysilicon), any conductive material (e.g., tungsten), or combinations of the above. The second non-insulating layer 28 may be formed by CVD, PVD, ALD, plating, the like and combinations of the above. The second non-insulating layer 28 is thicker than the first non-insulating layer 24 and thicker than the conductive layer 26. In one embodiment, the second non-insulating layer 28 is approximately 60 to 120 nanometers (600 to 1200 Angstroms) in thickness.

Figure 4:
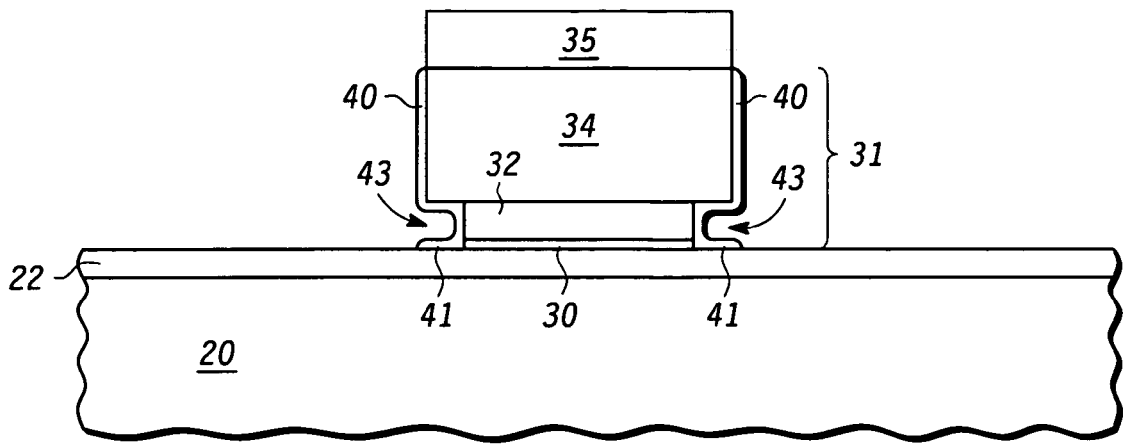
FIG. 4 illustrates the semiconductor device of FIG. 3 after forming an insulating layer in accordance with an embodiment of the present invention.

An (optional) second insulating layer 29 may be formed over the second non-insulating layer 28. The second insulating layer 29 is preferred if the reoxidation embodiment to be discussed below in regards to FIG. 4 is implemented. The second insulating layer 29 may be any insulating material, such as silicon nitride. The second insulating layer 29 may be formed by PVD, CVD, ALD, plating, the like and combinations of the above, and may be approximately 5–30 nanometers (50 to 300 Angstroms) in thickness.

Figure 2:
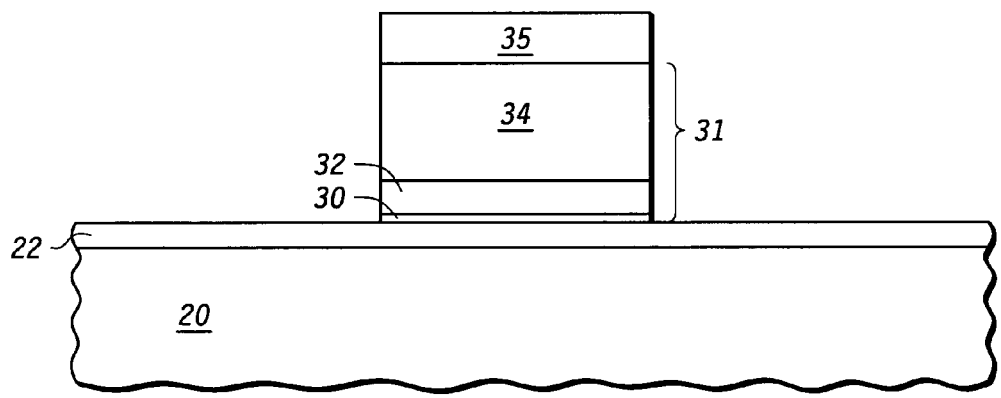
FIG. 2 illustrates the semiconductor device of FIG. 1 after patterning the multiple layers in accordance with an embodiment of the present invention.

After the first insulating layer 22, the first non-insulating layer 24, the conductive layer 26, the second non-insulating layer 28 and the second insulating layer 29 are formed, the first non-insulating layer 24, the conductive layer 26, the second non-insulating layer 28 and the second insulating layer 29 are patterned as shown in FIG. 2. In one embodiment, a photoresist layer (not shown) is formed and patterned over the semiconductor device 10. The photoresist layer is used to pattern the second insulating layer 29. The second insulating layer 29 may be used as a hard mask alone or together with the photoresist layer to pattern underlying layers (i.e., the first non-insulating layer 24, the conductive layer 26 and the second non-insulating layer 28). If the photoresist layer is removed at this point, an ash process, as known to a skilled artisan, may be used. Upon patterning, the second insulating layer 29 becomes a patterned insulating layer 35. The patterned insulating layer 35 may serve as an anti-reflective coating (ARC) during subsequent processing. In one embodiment, etching is performed to pattern the first non-insulating layer 24, the conductive layer 26, the second non-insulating layer 28 and the second insulating layer 29 using conventional etch chemistries and processes. Upon patterning, the first non-insulating layer 24 becomes a first patterned conductive layer 30, the conductive layer 26 becomes a second patterned conductive layer 32, and the second non-insulating layer 28 becomes a patterned non-insulating layer 34. The first patterned conductive layer 30, the second patterned conductive layer 32 and the patterned non-insulating layer 34 form the layers of a control electrode (gate electrode) 31. If not previously removed (i.e., if used as a mask for patterning the first non-insulating layer 24, then the conductive layer 26 or the second non-insulating layer 28), the photoresist layer may be removed using an ash process. The portion of the first insulating layer 22 that lies under the control electrode 31 will serve as the gate dielectric.

Figure 3:
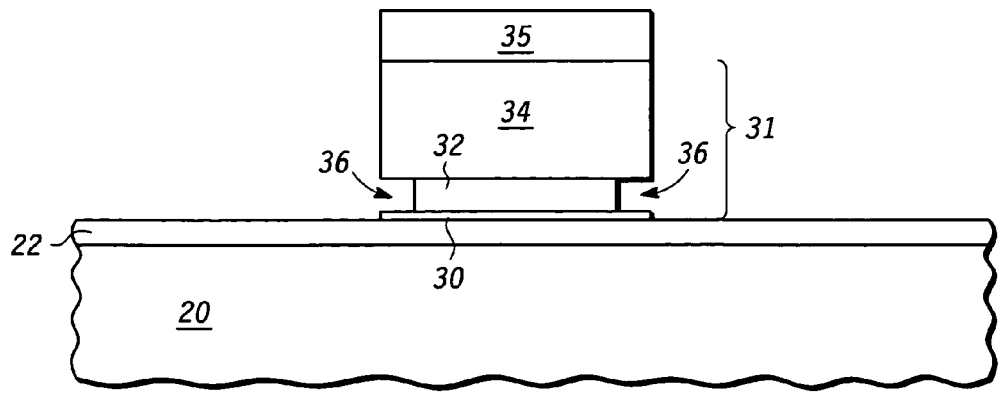
FIG. 3 illustrates the semiconductor device of FIG. 2 after notching a first layer in accordance with an embodiment of the present invention.

Illustrated in FIG. 3, after the control electrode 31 is patterned portions of the second conductive layer 32 are removed to create notches 36. In other words, the second conductive layer 32 is recessed relative to another layer, such as the patterned non-insulating layer. In one embodiment, the notches 36 are formed by etching the patterned conductive layer 32 selective to the first patterned conductive layer 30 and the patterned non-insulating layer 34. Hence, the first patterned conductive layer 30 and the second patterned conductive layer 32 should not be the same materials to enable a selective etch of portions of the second patterned conductive layer 32. In one embodiment, to form the notches 36, a wet etch of 40 ml of $HNO_3$+20 ml of $H_2O_2$+5 ml of 0.5% HF or an isotropic plasma etching can be used if the first patterned conductive layer 30 is any metal or metal alloy, the second patterned conductive layer 32 is doped silicon germanium and the patterned non-conductive layer 34 is polysilicon. In another embodiment, ACT® 940 sold by Air Products can be used to form the notches 36 if the first patterned conductive layer 30 is TiN, the second patterned conductive layer 32 is TaN and the patterned non-conductive layer 34 is polysilicon because ACT® 940 etches TiN to TaN at a ratio of approximately 1:20 at 65 degrees Celsius and etches polysilicon to TaN at a rate of approximately 1:16 at 65 degrees Celsius.

In one embodiment, after forming the notches 36, insulating layers 40 are formed along the exposed walls of the control electrode 31, as shown in FIG. 4. The materials used for the patterned insulating layer 35 generally do not form an oxide when exposed to the conditions used herein to form the insulating layers 40. Hence, it is unlikely that an oxide will form on the patterned insulating layer 35; however, if a different material is used an oxide may be formed. If the patterned insulating layer 35 was not present the insulating layers 40 would be formed on the top of the patterned non-insulating layer 34. However, it is desirable that no insulating material be formed over the top surface of the patterned non-insulating layer 34 as to enable a contact to be made during subsequent processing to the control electrode 31. Thus, if formed on the top of the patterned non-insulating layer 34 the insulating material would have to be removed if formed on the patterned non-insulating layer 34; however, this may be difficult to do. Therefore, the presence of the patterned insulating layer 35 is preferred.

The insulating layers 40 may be formed by a reoxidation process where the semiconductor device 10 is exposed to an oxygen environment at temperatures between 750 to 850 degrees Celsius. The oxygen environment may be a dry oxidation environment. In one embodiment, this process can be a rapid thermal oxidation (RTO) process. The insulating layer 40 is created by oxidizing the sides of the control electrode 31. As a result, the insulating layer 40 includes different insulating materials. For example, the patterned non-insulating layer 34 will oxidize and create a first oxide material along its exposed walls, the second patterned conductive layer 32 will create a second oxide material along its exposed walls, which are sidewalls, and the first patterned conductive layer 30 will create a third oxide material along its exposed sidewalls. As a skilled artisan should recognize there will probably be regions between the different oxides that are transition regions between the oxides meaning one oxide is transitioned to another oxide. Although portions of second patterned conductive layer 32 and the first patterned conductive layer 30 will be consumed (not shown) to form the oxides only small amounts of the layers will be converted to the oxide. However, portions of the first patterned conductive layer 30 that are exposed by the notches 36 will be converted to an insulator during the reoxidation process and will form oxide regions 41 since they are thin and exposed by the notches 36. The oxide regions 41 lie within notches 43. Therefore, by forming the oxide regions 41, the patterned first conductive layer 30 will have a length (lateral dimension) that is substantially equal to the length of the patterned second conductive layer 32. Furthermore, the patterned non-insulating layer 34 will have a length that is greater than the patterned first conductive layer 30 and that is greater than the patterned second conductive layer 32.

Figure 5:
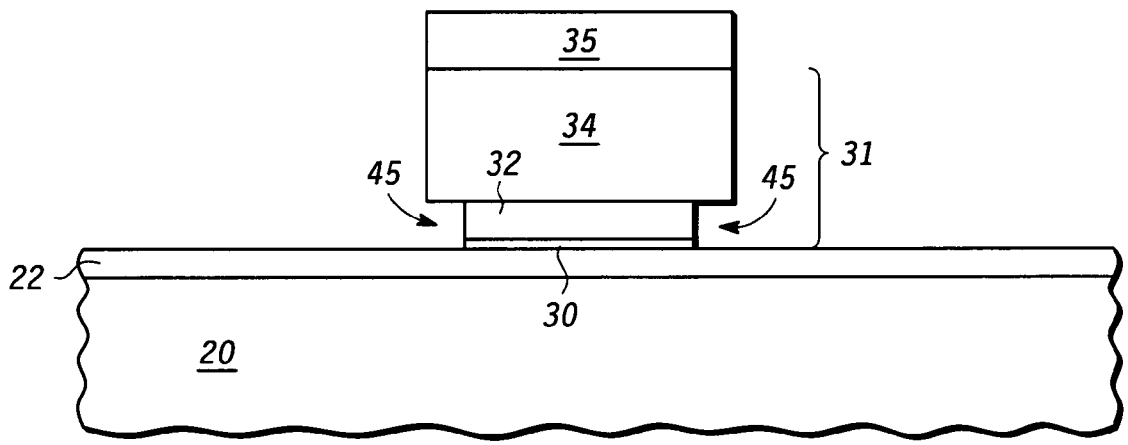
FIG. 5 illustrates the semiconductor device of FIG. 3 after notching a second layer in accordance with another embodiment of the present invention.

In another embodiment, the length of the patterned second conductive layer 32 is made approximately equal to the length of the patterned first conductive layer 30 by recessing the first patterned conductive layer 30 to form notches 45, as shown in FIG. 5. In this embodiment, the patterned non-insulating layer 34 also has a length that is greater than the patterned first conductive layer 30 and that is greater than the patterned second conductive layer 32. In an embodiment, an exposed lateral edge of the first conductive layer 30 may be selectively etched. In one embodiment, the recessing is formed by a soft etch process. The soft etch process, in one embodiment, is a dry etch that is selective to the first insulating layer 22 and the other layers in the control electrode 31. In one embodiment, the soft etch is a diluted etch process. In one embodiment where the first insulating layer 22 is silicon dioxide and the first patterned conductive layer 30 is TaSiN, $HBr/Cl_2/O_2/CF_4$ can be used in a plasma etch with an RF bias power below 25 Watts. In another embodiment, where the first insulating layer 22 is hafnium oxide and the first patterned conductive layer 30 is TaSiN, TaC, TaN or combinations of the above, approximately 100 sccm of $Cl_2$ can be used in a plasma etch with power set at approximately 4 mTorr, source power at approximately 1000 Watts, and a bias power at approximately 60 Watts. In another embodiment, TaC can be etched selectively to hafnium oxide using $AR/Cl_2$, $SF_6$, $BlC_3$ or $Cl_2$ plasma. Further processing described herein will follow from the structure in FIG. 4; however, the same processing can be used with the structure in FIG. 5.

After recessing the first patterned conductive layer 30, the first patterned conductive layer has a length that is smaller than originally formed which will decrease the channel length and the Miller capacitance of the semiconductor device being formed. In addition, control electrode 31 has notches that are made by a controllable process. The presence of the notches also aids halo implantation which in one embodiment is formed at an angle. To perform the halo implant at a tilt, the notch allows for the atoms to be implanted at tilts through only the first insulating layer 22. In other words, if the notches were not present the halo implants would not be able to be formed laterally as far under the patterned non-insulating layer 34 as they are formed when the notches are present because the material that would be present in the notches would block the implant. Thus, the resulting channel would have a longer length.

Figure 6:
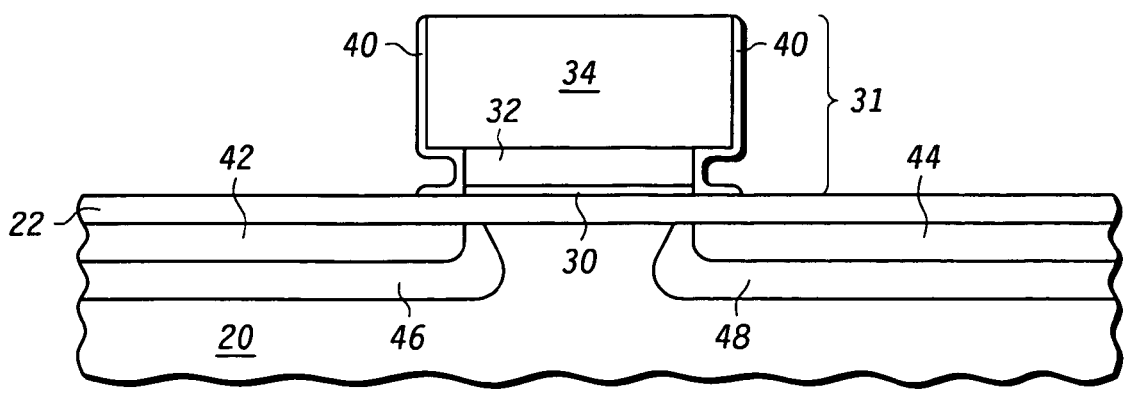
FIG. 6 illustrates the semiconductor device of FIG. 4 after forming source/drain extensions and source/drain halos in accordance with an embodiment of the present invention.
Figure 7:
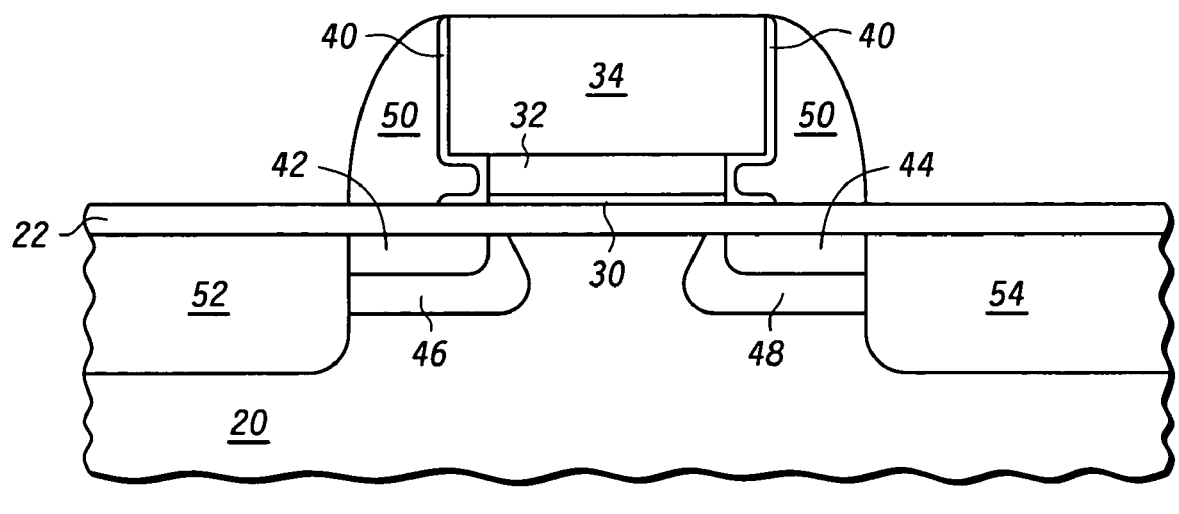
FIG. 7 illustrates the semiconductor device of FIG. 6 after forming sidewall spacers and source/drain regions in accordance with an embodiment of the present invention.

As shown in FIG. 6, after forming notches 43 and oxide regions 40, a source halo 46, a drain halo 48, a source extension 42 and a drain extension 44 are formed within the semiconductor substrate 20. In one embodiment, the source halo 46 and the drain halo 48 are formed by an angled ion implantation where the angle may be approximately 20 to 40 degrees normal to the surface of the semiconductor substrate 20. The doping concentration may be between approximately 5E17 to 8E18 atoms per centimeters cubed of either an n-type (e.g., phosphorus) or p-type (e.g., boron) dopant. The doping type for the source/drain halos 46, 48 is opposite that used for source/drain extensions 42, 44 and deep source/drain regions 52, 54. Due to the implantation being performed at a tilt, portions of the source halo 46 and the drain halo 48 underlie portions of the control electrode 31.

The source extensions 42 and the drain extensions 44 may be formed by implanting at zero degrees relative to the normal to the surface of the semiconductor substrate 20 or at an angle. The dopants used for the source extensions 42 and the drain extensions 44 may be the same as that used for the source halo 46 and the drain halo 48, however their concentration and hence, the dosage used in greater. In one embodiment, the doping concentration may be between approximately 1E19 to 5E20 atoms per centimeters cubed of either an n-type (e.g., phosphorus) or p-type (e.g., boron) dopant.

After forming the source halo 46, the drain halo 48, the source extension 42 and the drain extension 44, spacers 50 are formed along the sides of the control electrode 31, and a deep source 52 and a deep drain 53 are formed in the semiconductor substrate 20. The spacers 50 preferably fill the notches. The spacers 50 may be formed by depositing an insulating layer, such as silicon nitride ($Si_xN_y$), over the semiconductor device 10 and anisotropically etching the insulating layer using conventional chemistries. Alternatively, other spacer implementations and structures can be used.

The deep source 52 and deep drain 54 are formed using the spacers 50 and the control electrode 31 as a mask. The same dopants that were used to form the source halo 46, the drain halo 48, the source extension 42 and the drain extension 44 may be used; however, the dopant concentration will be greater than that used to form the extensions 42, 44 and greater than that used to form the halos 46, 48. In one embodiment, the doping concentration may be between approximately 5E19 to 1E21 atoms per centimeters cubed of either an n-type (e.g., phosphorus) or p-type (e.g., boron) dopant. The source extension 42 and the deep source 52 form the source region (a current electrode) of the semiconductor device 10 and the drain extension 44, and the deep drain 54 form the drain region (a current electrode) of the semiconductor device 10.

By now it should be appreciated that there has been provided a method that reduces Miller capacitance while increasing the short channel effect immunity by virtue of the advantageous placement of the halo implants. In addition, since the channel length of the semiconductor device 10 is shorter than that which would result from performing only an etch process of the multilayers, the lithographic process being used does not need to be able to print the resulting channel length. In other words, the resulting channel length can be less than that which the lithographic process can print, thereby extending the ability to use older lithographic processes with smaller geometry devices.

In the foregoing specification, the invention has been described with reference to specific embodiments. However, one of ordinary skill in the art appreciates that various modifications and changes can be made without departing from the scope of the present invention as set forth in the claims below. For example, the source and drain regions can be switched or designed in an asymmetric way. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. In addition, as used herein the word "layer" is not limited to a single layer and instead can include a stack (two or more) of materials, unless stated otherwise.

What is claimed is:

1. A method for forming a semiconductor device comprising:
   providing a substrate having a surface;
   forming an insulating layer over the surface of the substrate;
   forming a first patterned conductive layer over the insulating layer;
   forming a second patterned conductive layer over the first patterned conductive layer;
   forming a patterned non-insulating layer over the second patterned conductive layer; and
   selectively removing portions of the first and second patterned conductive layers to form a notched control electrode for the semiconductor device.

2. The method of claim 1, further comprising implanting source/drain regions in the substrate.

3. The method of claim 1, further comprising forming a halo implant in the substrate.

4. The method of claim 1, wherein forming the patterned non-insulating layer comprises forming the patterned non-insulating layer of polysilicon.

5. The method of claim 1, wherein the first patterned conductive layer comprises one of tantalum carbide, tantalum nitride, nickel silicide, tantalum silicide, cobalt suicide, or tungsten.

6. The method of claim 1, wherein the first patterned conductive layer comprises one or titanium nitride, rhenium, platinum, ruthenium oxide, rhodium suicide, palladium suicide, or tungsten carbon nitride.

7. The method of claim 1, wherein the first patterned conductive layer is formed to a thickness of between 1 and 40 nanometers.

8. The method of claim 1, wherein the second patterned conductive layer comprises silicon germanium.

9. The method of claim 1, wherein die second patterned conductive layer comprises one of doped silicon germanium, doped silicon, doped silicon carbide, silicide, metal carbide or metal nitride.

10. The method of claim 1, wherein the insulating layer comprises one of hafnium oxide, aluminum nitride, aluminum oxide, tantalum pentoxide, barium titanium oxide, lanthanum aluminate or zirconium oxide, or combinations thereof.

11. The method of claim 1, wherein selectively removing portions of the first and second patterned conductive layers further comprises:
   selectively etching a predetermined portion of an exposed lateral edge of the second patterned conductive layer; and
   oxidizing an exposed portion of the first patterned conductive layer.

12. The method of claim 1, wherein selectively removing portions of the first and second patterned conductive layers further comprises:
   selectively etching a predetermined portion of an exposed lateral edge of the second patterned conductive layer; and
   selectively etching an exposed portion of the first patterned conductive layer of the using a soft etch semiconductor manufacturing process.

13. The method of claim 1, further comprising forming a second insulating layer in the notches and on the opposite sides of the notched control electrode.

14. The method of claim 1, further comprising forming sidewall spacers on the second insulating layer on the opposite sides and in the notches of the notched control electrode.

15. The method of claim 1, wherein after selectively removing portions of the first and second patterned conductive layers, the first and second patterned conductive layers have lengths that arc substantially equal.

* * * * *

UNITED STATES PATENT AND TRADEMARK OFFICE
CERTIFICATE OF CORRECTION

| | | |
|---|---|---|
| PATENT NO. | : 7,105,430 B2 | Page 1 of 1 |
| APPLICATION NO. | : 10/811461 | |
| DATED | : March 26, 2004 | |
| INVENTOR(S) | : Marius K. Orlowski et al. | |

It is certified that error appears in the above-identified patent and that said Letters Patent is hereby corrected as shown below:

In Column 8, Line 3, Claim No. 5:
    Change "suicide" to --silicide--

In Column 8, Line 7, Claim No. 6:
    Change "suicide" to --silicide--

In Column 8, Lines 7-8, Claim No. 6:
    Change "suicide" to --silicide--

In Column 8, Line 14, Claim No. 9:
    Change "die" to --the--

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 7,105,430 B2 Page 1 of 1
APPLICATION NO. : 10/811461
DATED : September 12, 2006
INVENTOR(S) : Marius K. Orlowski et al.

It is certified that error appears in the above-identified patent and that said Letters Patent is hereby corrected as shown below:

In Column 8, Line 3, Claim No. 5:
    Change "suicide" to --silicide--

In Column 8, Line 7, Claim No. 6:
    Change "suicide" to --silicide--

In Column 8, Lines 7-8, Claim No. 6:
    Change "suicide" to --silicide--

In Column 8, Line 14, Claim No. 9:
    Change "die" to --the--

This certificate supersedes Certificate of Correction issued August 7, 2007.

Signed and Sealed this

Twenty-eighth Day of August, 2007

JON W. DUDAS
*Director of the United States Patent and Trademark Office*